United States Patent [19]

Krenz

[11] 4,414,298
[45] Nov. 8, 1983

[54] PRINTED CIRCUIT BOARD MOUNT FOR BATTERIES AND THE LIKE

[75] Inventor: Horst M. Krenz, St. Joseph, Mich.

[73] Assignee: Heath Company, St. Joseph, Mich.

[21] Appl. No.: 396,927

[22] Filed: Jul. 9, 1982

[51] Int. Cl.³ .............................................. H01M 2/10
[52] U.S. Cl. .......................................... 429/99; 429/1; 429/9; 429/100
[58] Field of Search .................... 429/1, 9, 96–100, 429/157, 158, 159; 339/17 R

[56] References Cited

U.S. PATENT DOCUMENTS

| | | | |
|---|---|---|---|
| 3,981,139 | 9/1976 | Jackle | 58/23 R |
| 3,992,225 | 11/1976 | Sykes | 429/1 |
| 4,087,960 | 5/1978 | Roichi | 58/127 R |
| 4,247,603 | 1/1981 | Leffingwell et al. | 429/1 |

*Primary Examiner*—Charles F. Lefevour

[57] ABSTRACT

This disclosure depicts a low-cost assembly for mounting a battery, fuse, or other terminal-bearing electrical device on a printed circuit board supporting an electrically conductive pattern. The assembly comprises a one-piece molded receptacle sized and internally configured to receive one or more of such electrical devices, said receptacle having sidewalls and opposed end walls, one sidewall having a pair of slots, one adjacent each end wall. A pair of generally Z-shaped, resilient, electrically conductive, multi-function sheet material members simultaneously provide total mechanical retention of the receptacle on the printed circuit board and make electrical interconnection between an electrical device loaded in the receptacle and the printed circuit board conductive pattern. The assembly provides for total mechanical and electrical coupling with the printed circuit board of a terminal-bearing electrical device loaded into the receptacle.

1 Claim, 6 Drawing Figures

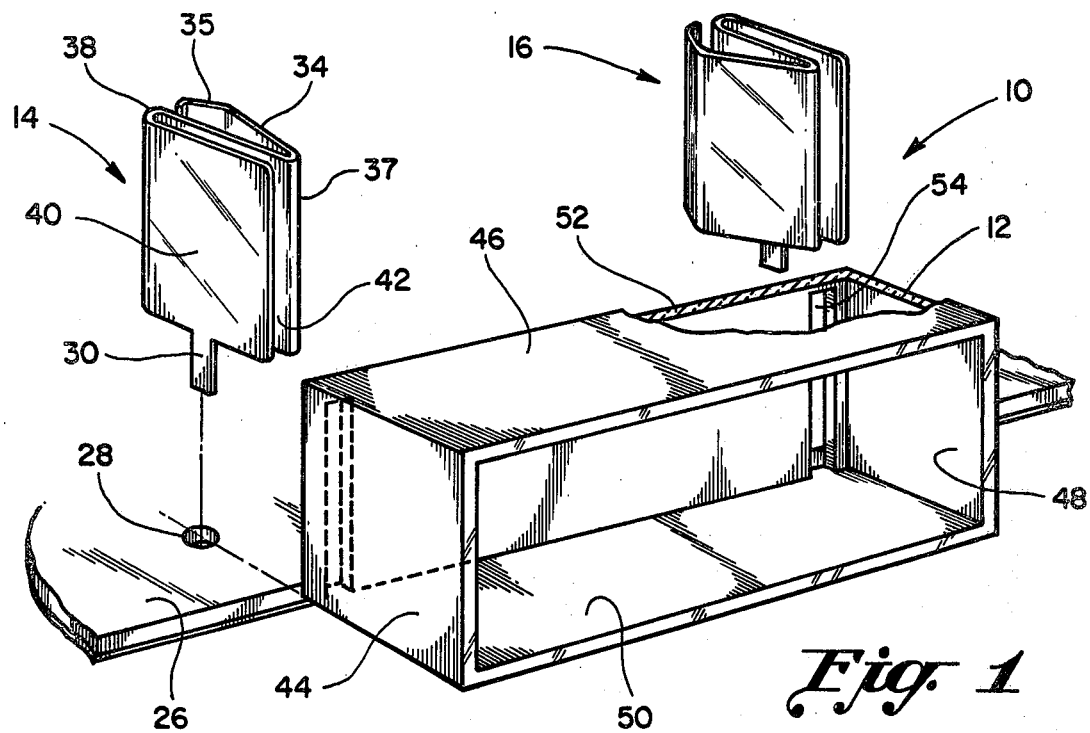
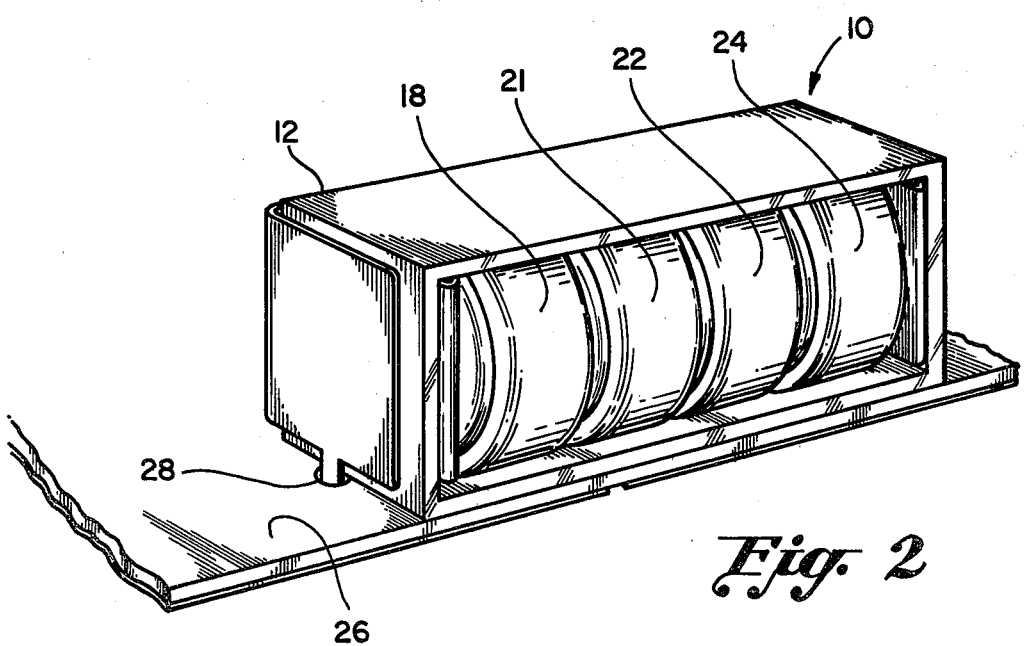

PRINTED CIRCUIT BOARD MOUNT FOR BATTERIES AND THE LIKE

BACKGROUND OF THE INVENTION

1. Field of the Invention

This invention relates generally to the field of printed circuit boards.

More particularly, this invention concerns a low-cost structure for mechanically and electrically coupling a battery, fuse or other such terminal-bearing electrical device to a printed circuit board.

2. Art

The following are being submitted to the Patent and Trademark Office for its evaluation as to their possible relevance to the claimed subject matter. It is believed to be the closest of the art of which applicant(s) is aware, but applicant(s) makes no admission as to the fact of its being "prior art", to its relevance in fact, to its legal sufficiency or to its priority in time, nor does applicant(s) represent that no better art exists.

| Item | | Relevant Disclosure |
|---|---|---|
| 1. | U.S. Pat. No. 4,247,603 Leffingwell et al | Battery case mountable on printed circuit board |
| 2. | U.S. Pat. No. 3,992,225 Sykes et al | Printed circuit board battery pack |
| 3. | U.S. Pat. No. 3,981,139 Jackle | Battery mountable on printed circuit board |
| 4. | U.S. Pat. No. 4,087,960 Koichi | Battery mountable on printed circuit board |

3. Shortcomings of the Prior Art

Among the problems, defects or other drawbacks found in the prior art are the following:

1. It is most common to provide battery power to a printed circuit board for an electric product by an arrangement wherein the battery is supported in a compartment integral with or affixed to the casing for the product. The compartment in the casing has terminals making engagement with the battery. Lead wires are connected between the printed circuit board and the battery terminals after the board is installed in the casing. This approach suffers primarily from the labor cost incurred in the installation of the terminals and in the connection of the wires to the battery and PC board terminals, and in the inability during manufacture to test the PC board sub-assembly as an independent unit before installation in the casing.

2. Another approach is shown in U.S. Pat. No. 4,247,603—Leffingwell et al. Leffingwell provides a battery case which is mounted directly on a PC board. The Leffingwell et al approach is, however, unnecessarily expensive, requiring separate terminals for making electrical contact with the battery or batteries and separate terminal pins for electrically and mechanically joining the battery case to the PC board.

FEATURES, ADVANTAGES AND OBJECTS OF THE INVENTION

Among the features, advantages and objects of the present invention are the following:

1. To provide a very low cost assembly for providing total mechanical support of a battery, fuse or other such terminal-bearing electrical device on a printed circuit board, while effecting electrical interconnection of the device to an electrical pattern on the printed circuit board.

2. It is another object to provide such an assembly which has only three parts and requires an absolute minimum of assembly operations.

3. It is still another object to provide such an assembly which allows for testing of the printed circuit board sub-assembly as an independent unit prior to installation in the containing product.

BRIEF DESCRIPTION OF THE FIGURES

The figures are views depicting the invention.

FIG. 1 is an exploded, partially cut-away perspective view of an assembly according to this invention providing for total mechanical and electrical coupling of a battery, fuse, or other such electrical device with a printed circuit board.

FIG. 2 is a perspective view of the FIG. 1 assembly installed on a printed circuit board, with four batteries loaded within a receptacle forming part of the assembly.

DESCRIPTION OF THE PREFERRED EMBODIMENT(S)

Figure 3:
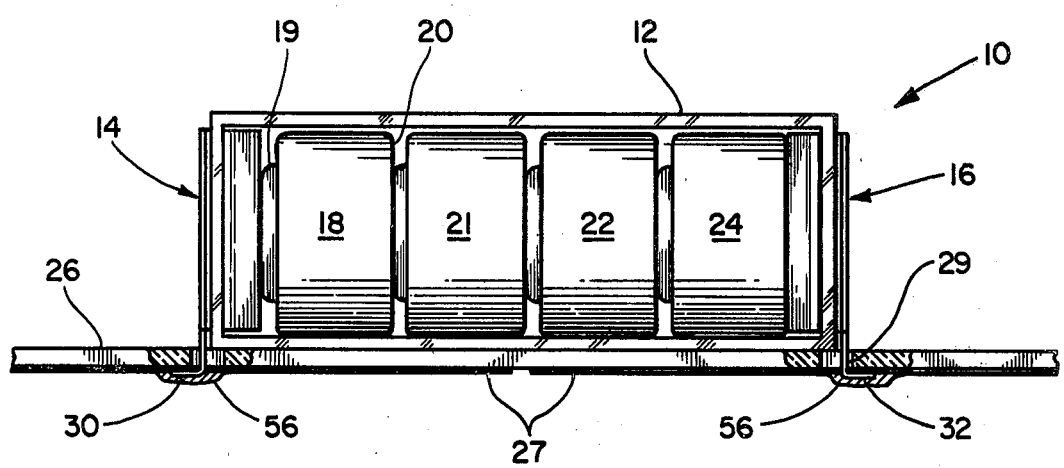
FIG. 3 is a side elevational view of the assembly shown in FIGS. 1 and 2.
Figure 4:
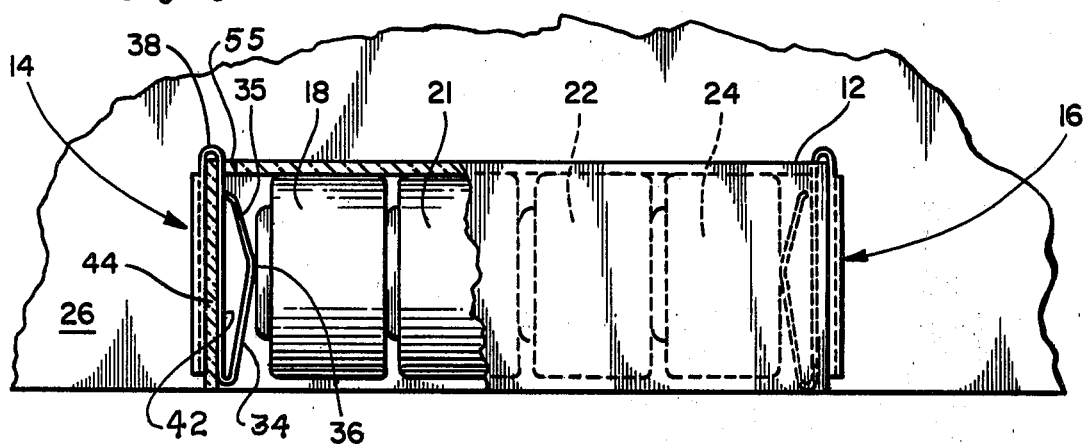
FIG. 4 is a top elevation view of the assembly, partially cut-away to show internal components.

This specification includes a description of the invention, of the best mode presently contemplated for carrying out the invention, and the claims.

Best Mode

The invention is disclosed in the drawing(s) as follows:

| Referent Number | Referent Name | Brief Statement of Referent Connections, Function, Operation and/or Result, if Appropriate |
|---|---|---|
| 10 | assembly | |
| 12 | receptacle | Preferably one-piece, molded resin |
| 14 | clip member | Formed from electrically conductive sheet material such as tin-plated spring steel, phosphor bronze (spring), spring brass, monel, berylium copper, or nickel silver |
| 16 | clip member | same construction as member 14, a but mirror image |
| 18 | battery | could be fuse or other such terminal-bearing electrical device |
| 19 | terminal | |
| 20 | terminal | |
| 21 | battery | |
| 22 | battery | |
| 24 | battery | |
| 26 | printed circuit board | |
| 27 | conductive pattern | |
| 28 | aperture | |
| 29 | aperture | |
| 30 | tab | Folded over against back surface of board 26 and soldered to provide total mechanical support for assembly 10 on board 26 |

-continued

Figure 3A:
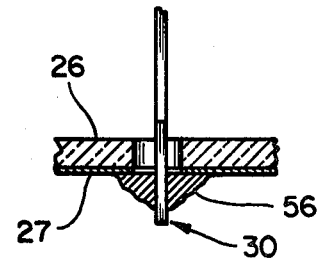
FIG. 3a depicts an alternative approach to securing the assembly to a printed circuit board.

| Referent Number | Referent Name | Brief Statement of Referent Connections, Function, Operation and/or Result, if Appropriate |
|---|---|---|
| 32 | tab | (FIG. 3), or soldered without bend-over (see FIG. 3a). |
| 34 | internal leg | Snapped into receptacle 12 to make electrical and resilient mechanical engagement with the terminal of a battery inserted into the receptacle; angle relative to section 42 is such that distal end 35 of leg 34 abuts wall 50 after insertion of member 14 through slot in wall 52 to prevent inadvertent escape of member 14 from receptacle. |
| 35 | distal end | Bent inwardly to facilitate withdrawal of member 14 from receptacle 12 through slot. Radius point 36 of distal end 35 is beyond the battery centerline (toward open end of receptacle) such clip member serves to retain battery. |
| 36 | radius point | |
| 37 | front fold | |
| 38 | rear fold | |
| 40 | external leg | |
| 42 | center section | with leg 40, embraces wall 44 when member 14 is installed. |
| 44 | wall | |
| 46 | wall | |
| 48 | wall | |
| 50 | wall | |
| 52 | wall | |
| 54 | slot | |
| 55 | slot | |
| 56 | solder | |

Alternative Mode

Figure 5:
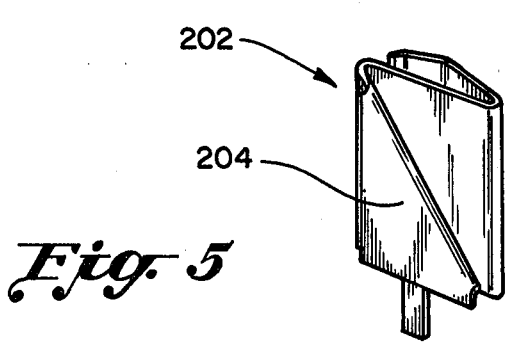
FIG. 5 is an alternative embodiment of clip members 14, 16 shown in FIGS. 1–4.

A brief description of an alternative mode of the invention follows. Please refer to FIG. 5.

| Referent Number | Referent Name | Brief Statement of Referent Connections, Function, Operation and/or Result, if Appropriate |
|---|---|---|
| 202 | clip member | Like member 14 except that external leg is folded to the side at 90 degrees to the fold 36 in the member 14. |

While particular embodiments of the invention have been shown and described, it will be obvious to those skilled in the art that changes and modifications may be made without departing from the invention in its broader aspects. The aim, therefore, in the appended claims is to cover all such changes and modifications as fall within the true spirit and scope of the invention.

What is claimed is:

1. A low-cost assembly for mounting a battery, fuse, or other terminal-bearing electrical device on a printed board supporting an electrically conductive pattern, comprising:

a one-piece molded receptacle sized and internally configured to receive one or more of such electrical devices, said receptacle having side walls and opposed end walls, said receptacle having in a side wall a pair of slots, one adjacent each of said end walls;

a pair of generally Z-shaped, resilient, electrically conductive, multi-function sheet material members for simultaneously providing total mechanical retention of said receptacle on the printed circuit board and for making electrical interconnection between an electrical device loaded in the receptacle and the printed circuit board conductive pattern, each member having a folded first portion configured to pass fold-first through one of said receptacle slots against the restorative forces in the fold and to snap into secure embracing engagement with the end wall adjacent the penetrated slot and with a free leg within the receptacle positioned and configured to resiliently engage a terminal of an electrical device loaded in the receptacle, a distal end of said free leg engaging the slot-containing wall of said receptacle to prevent inadvertent escape of said member therefrom, said member having integral with said first portion an outside leg which is external to said receptacle when said member is snapped into said receptacle, said outside leg having an edge tab adapted to be mechanically secured to said printed circuit board and soldered to said conductive pattern, said assembly thereby providing for total mechanical and electrical coupling between a terminal-bearing electrical device loaded into the receptacle and the printed circuit board.

* * * * *